(12) United States Patent
Hata et al.

(10) Patent No.: US 6,956,165 B1
(45) Date of Patent: Oct. 18, 2005

(54) UNDERFILL FOR MAXIMUM FLIP CHIP PACKAGE RELIABILITY

(75) Inventors: William Y. Hata, Saratoga, CA (US); Christopher J. Pass, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/879,829

(22) Filed: Jun. 28, 2004

(51) Int. Cl.[7] .......................... H01L 23/28; H05K 5/06
(52) U.S. Cl. ...................... 174/52.2; 257/790
(58) Field of Search ............... 174/52.2, 52.4; 257/790

(56) References Cited

U.S. PATENT DOCUMENTS

| | | | |
|---|---|---|---|
| 5,442,240 A * | 8/1995 | Mukerji | 257/783 |
| 5,880,530 A * | 3/1999 | Mashimoto et al. | 257/783 |
| 6,335,571 B1 * | 1/2002 | Capote et al. | 257/787 |
| 6,815,831 B2 * | 11/2004 | Dias | 257/778 |

* cited by examiner

*Primary Examiner*—Hung V. Ngo
(74) *Attorney, Agent, or Firm*—Morgan, Lewis & Bockius LLP

(57) ABSTRACT

An electronic package is disclosed with an underfill with multiple areas of different stiffness and a method of constructing same. An underfill shell region that contacts the chip and the substrate is stiffer than an underfill build region that does not contact either the chip or the substrate. The variation in stiffness may be achieved using materials in the shell that include more filler and/or less solvents than the materials in the bulk region. The underfill may also be composed of a single material with an adhesion to the chip and substrate that is stronger than the material's internal cohesion (e.g., a long chain polymer with an active carboxyl group at the end of the chain). This can be achieved by exposing the chip and substrate surfaces to a curing substance (e.g., vaporized hydrofluoric acid).

18 Claims, 2 Drawing Sheets

UNDERFILL FOR MAXIMUM FLIP CHIP PACKAGE RELIABILITY

This invention relates generally to the packaging of semiconductor devices. More particularly, this invention relates to a semiconductor device package that minimizes the impact of different coefficients of thermal expansion (CTE) associated with the environment in which the package exists. The invention further relates to a unique underfill with multiple regions of different stiffness that reduces package warpage and chip shear and cracking due to internal thermal stress caused, for example, by differences in CTEs between different layers of the package.

BACKGROUND OF THE INVENTION

One important characteristic of microelectronic technology is that over time integrated circuit geometry becomes smaller and smaller and circuitry density gets higher and higher, resulting in more powerful performance and more complex functionality per chip. This dramatic performance and functionality improvement, in turn, requires many more input/output (I/O) connections between a chip and a printed circuit board (PCB) that many of today's chips have hundreds, or even thousands, of interconnection pads. Even though the chip size keeps growing, the space left for each pad on the chip keeps shrinking. The shrinkage of the chip pad area has reached a degree that exceeds the capability of traditional wire bond technology to make connections from the chip to the substrate.

Flip chip (FC) technology has proved to be a more attractive approach to solving the pad area limitation problem. In a traditional FC package, a pattern of solder bumps is formed on the side of the chip that carries the integrated circuit. The same pattern of solder pads is formed on the top side of a substrate. The chip is then flipped upside down, aligning its pattern of solder bumps with the pattern of solder pads formed on the substrate, resulting in the contact of the solder bumps of the chip with the solder pads of the substrate. As the chip and the substrate are heated while in this alignment, the solder in the solder bumps and the solder pads flows together. Upon cooling, the solder forms mechanical and electrical joints (i.e., solder joints) that connect the chip to the substrate. Additionally, an underfill and a molding compound are added to the package to increase the package's structural stability.

Substrates made of different materials have different advantages. Ceramic has been chosen for FC substrates from the very beginning because of its ease of assembly and high-temperature performance. However, the high cost of ceramic substrates limits their application to high-end products such as a CPU. Due to its low cost, organic material is more commonly used in a wider spectrum of applications, such as communication and automotive products. For example, bismaleimide triazine (BT) is one of the most popular advanced laminates and is widely used in FC substrates.

The connection between the chip and the substrate is usually formed in a high temperature environment (e.g., 220° C.). The higher the CTE of a substance, the more that substance tends to contract when the substance is heated to a certain temperature and then subsequently cools down. Because of the CTE difference between the chip and the substrate, the chip and the substrate bend to different degrees, causing thermal-mechanical stress and strain. This thermal stress and strain concentrates on the solder joints between the chip and the substrate potentially causing early fatigue failure of the system if any solder joint is broken due to the thermal stress and strain concentration. This problem is more prominent with organic substrates than with ceramic substrates. For instance, while the CTE of the chip, mainly silicon, is only about 3 PPM/° C., and the CTE of ceramic material is about the same, the CTE of the BT substrate could be as high as 17 PPM/° C. in the plane of the substrate.

One approach to solve this stress and strain concentration problem is to add an underfill by completely filling the open space between the chip and the substrate with a liquid epoxy. The underfill material most commonly used in the industry has two components: an epoxy-based polymer and a filler material composed of small, hard particles. The filler material is usually a ceramic, and is usually silicon dioxide ($SiO_2$). Upon curing, the resulting encapsulation provides thermal stress relief by spreading the concentrated stress and strain from the deformed solder joints to the underfill.

There are several ways that the underfill material is added to the open space between the chip and the substrate. A common technique is the capillary underfill (CUF) technique, wherein the underfill material is added by re-heating the FC bonded device to reduce the thermal strain and then injecting underfill material into the space between the chip and the substrate whereupon capillary action draws the underfill between the solder balls. Another technique is the "no flow" underfill (NUF) technique, wherein the underfill material is deposited onto the substrate, and the chip is subsequently pressed onto the underfill material. Yet another technique is the wafer level underfill (WUF) technique, wherein the underfill material is deposited over an entire wafer, the wafer is sawn or cut into individual chips, and the chips are attached to the substrate by raising the temperature of and melting the underfill material. Upon cooling, the underfill material attaches the chip to the substrate. Finally, another technique is the molded underfill process (MUF), wherein the underfill is injected into the space between the chip and substrate such that the underfill material surrounds and encapsulates the entire chip-substrate assembly.

Besides stress and strain concentration, another CTE-related issue is substrate warpage wherein the bottom surface of the substrate contracts more freely than the top surface of the substrate due to solder joint restraints from the chip, causing the substrate to bow into a convex shape. The degree of substrate warpage mainly depends on the size of the chip and the substrate. When the substrate size is less than 27 $mm^2$, the substrate warpage is a less critical problem. However, for large flip chip substrates wherein the chip size could be several hundred square millimeters, the substrate warpage could easily exceed 8 mils, the standard set by the Joint Electron Device Engineering Council (JEDEC). Excessive warpage of the substrate prevents the attachment of the substrate to the PCB and is one of many factors causing low yields. Excessive warpage of the substrate may also cause chip shear and cracking because chip material generally has a low tensile strength. This problem remains substantially unsolved after underfill curing because the existing underfill material, designed primarily to deal with stress and strain concentration on the solder joints, is relatively resilient and not stiff enough to provide the substrate the needed support to prevent warpage.

In view of the foregoing discussion, it is highly desirable to provide an improved underfill material that maintains solder joint reliability while decreasing substrate warpage and chip shear and cracking.

SUMMARY OF THE INVENTION

The present invention addresses the aforementioned problems by a novel method and apparatus for packaging electronic devices. In particular, the invention includes an underfill that has multiple regions of different stiffness. The underfill shell (the regions of the underfill that contact the top surface of the substrate and that contact the bottom surface of chip) is stiffer than the underfill bulk (the regions of the underfill that do not contact either the top surface of the substrate or the bottom surface of chip). The stiff underfill shell helps to minimize substrate warpage and chip shear and cracking due to the differing chip and substrate CTEs and the usually low tensile strengths of chips. The resilient underfill bulk is acceptable because the solder joints are usually composed of materials having high tensile strengths.

As is known in the art, one way of measuring the stiffness of materials is using Young's modulus. The stiffer a material, the higher its Young's modulus. The more resilient a material, the lower its Young's modulus. Underfill material in the prior art consisted of a single component with a uniform Young's modulus. In the present invention, the underfill material has multiple areas of different Young's modulus. The stiff underfill shell has a relatively high Young's modulus while the resilient underfill bulk has lower Young's modulus.

The dual stiffness of the underfill can be achieved in at least two ways. First, the underfill may be composed of more than one material. In this case, the underfill shell material is stiffer than the underfill bulk material. Second, the underfill may be composed of one material. In this case, the underfill bulk's internal cohesion may be weaker than the adhesion that the underfill shell may have to the bottom surface of the chip and the top surface of the substrate.

BRIEF DESCRIPTION OF THE DRAWINGS

For a better understanding of the invention, reference should be made to the following detailed description taken in conjunction with the accompanying drawings, in which.

DETAILED DESCRIPTION OF THE INVENTION

Figure 1:
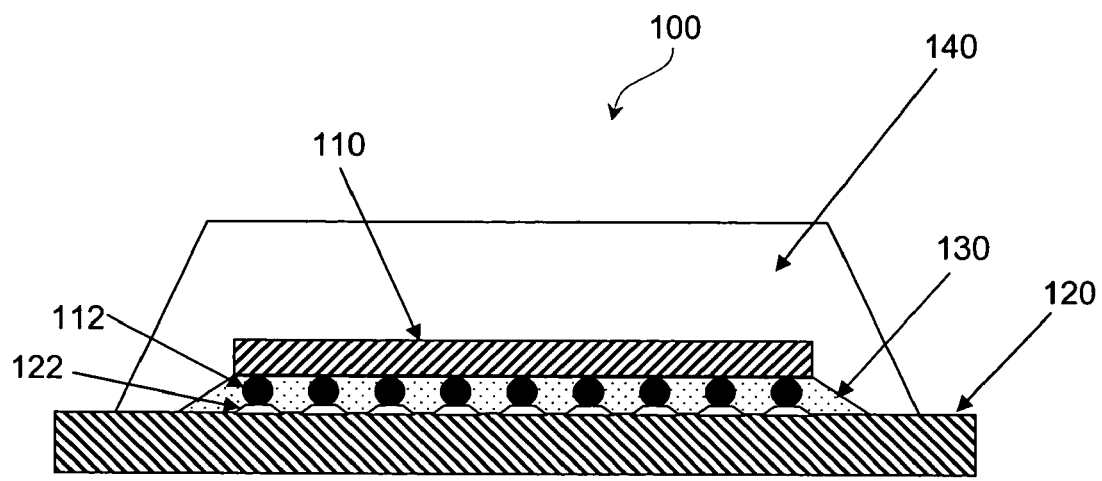
FIG. 1 is a cross-section of a prior art FC package.

FIG. 1 shows a traditional FC package. A pattern of solder bumps or solder balls 112 is formed on one side of chip 110 that carries the integrated circuits (the bottom surface of chip 110). Chip 110 is flipped to the orientation shown in FIG. 1 and its pattern of solder bumps is aligned with the same pattern of solder pads 122 formed on substrate 120. Chip 110 is then lowered onto substrate 120 so that its solder bumps 112 contact solder pads 122 of substrate 120. Upon heating, the solder in bumps 112 and pads 122 flows together; and upon cooling, the solder forms solder joints that connect chip 110 to substrate 120. Then, underfill 130 and molding compound 140 are added to the package. As indicated above, the underfill typically is an epoxy-based polymer with a ceramic filler. The molding compound typically is silica-filled epoxy.

Figure 2:
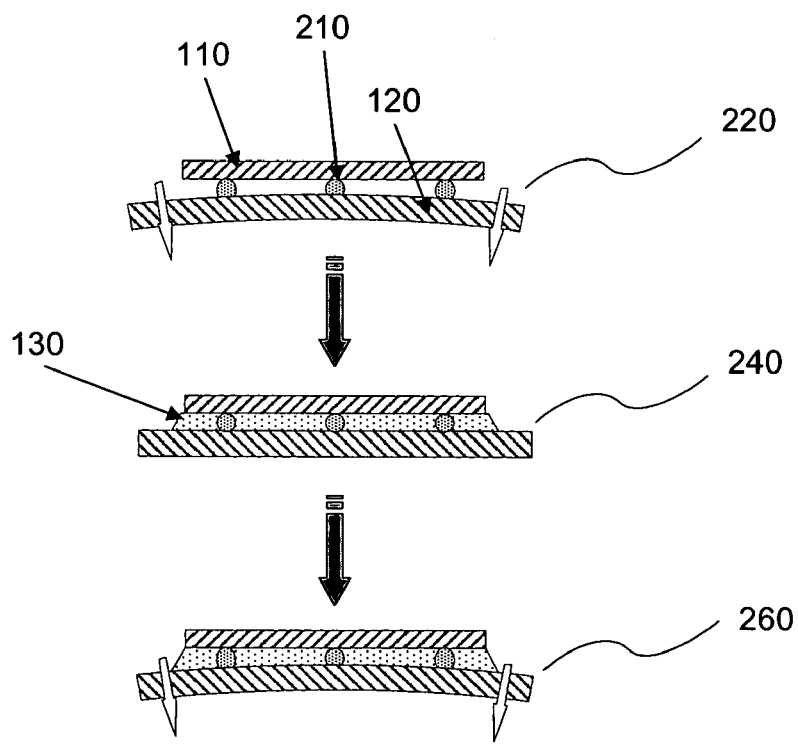
FIG. 2 is a cross-section of a prior art FC package with different views of the package at different points of manufacture.

FIG. 2 is a schematic description of the thermomechanical deformation experienced by an organic substrate at different stages in an IC packaging process. As shown in view 220 of FIG. 2, after solder joints 210 are formed connecting chip 110 to substrate 120, substrate 120 cools to room temperature and contracts more than chip 110 causing substrate 120 to bend into a convex shape. This contraction difference between chip 110 and substrate 120 produces thermal stress and strain concentration on solder joints 210 between chip 110 and substrate 120. If any of solder joints 210 is broken, then a disconnection between chip 110 and substrate 120 occurs, potentially causing early fatigue failure of the system.

View 240 in FIG. 2 shows the FC bonded device from view 220 after it has been re-heated to a temperature of 70–100° C. to reduce the thermal strain and then injected with underfill material 130 in the space between chip 110 and substrate 120. Ideally, the underfill material will completely relieve the stress on solder joints 210 after it cures by spreading the concentrated stress and strain from solder joints 210 to itself. Unfortunately, after the underfill cures, the substrate may still contract into a convex shape (substrate warpage) as shown in view 260 in FIG. 2, causing additional stress on solder joints 210.

The solder joint connection to the chip and to the substrate is relatively weak and can easily be broken. If the Young's modulus is uniform throughout the material, the stress is uniform from the chip to the substrate. High stress at the chip interfaces (areas where the underfill contacts the chip) may cause the chip to crack because the chip's surface dielectric materials have poor tensile strength.

The present invention includes an underfill with multiple areas of different Young's modulus (or stiffness). The underfill comprises two areas of differing stiffness. The area that contacts the bottom surface of the chip and the top surface of the substrate is the underfill shell, while the area that does not contact either the chip or the substrate is the underfill bulk. The underfill shell is stiffer than the underfill bulk (i.e., the underfill shell has a higher Young's modulus than the underfill bulk). The underfill shell's stiffness "locks" the position of the solder joints relative to the chip and the substrate, providing support at the points where the solder joints connect to the chip and the substrate. In the underfill bulk, the Young's modulus is lower and the strain is higher, which allows for more physical displacement. This resilience in the underfill bulk is acceptable because the lead solder joints have very high ductility and can deform significantly without cracking or breaking. Together, this forms an underfill with a relatively high average Young's modulus and minimal strain at the chip and substrate surfaces.

Figure 3:
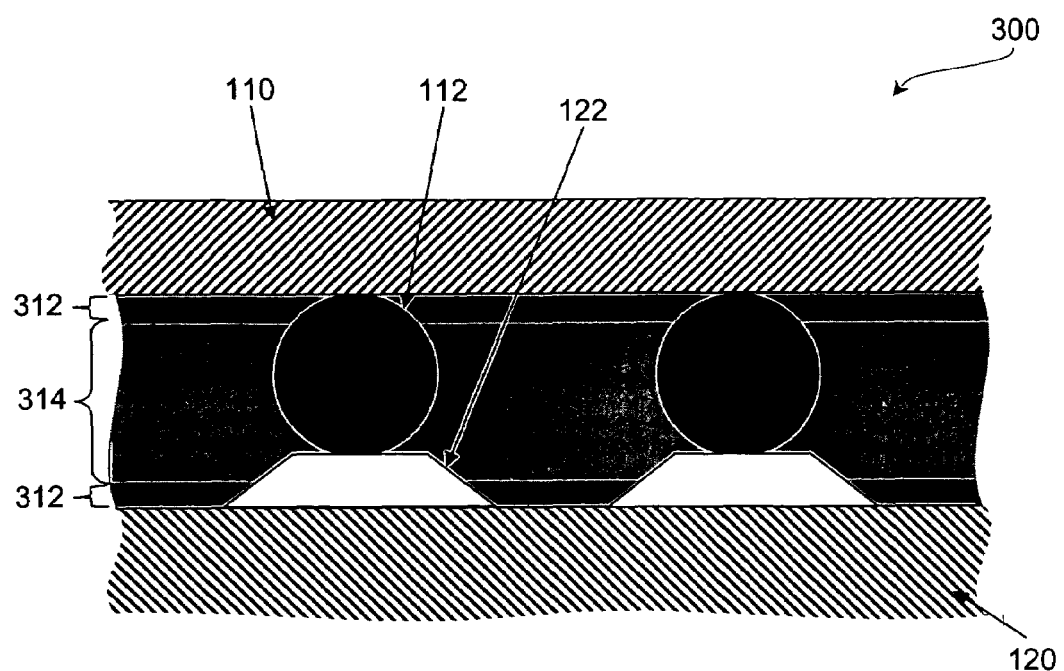
FIG. 3 is a cross-section of an embodiment of the present invention wherein the underfill is composed of two materials.

One embodiment of the underfill is shown in FIG. 3. In this embodiment, the underfill comprises an underfill shell 312 and an underfill bulk 314. Underfill shell 312 is positioned adjacent to chip 110 and substrate 120. Underfill bulk 314 is positioned such that it does not contact chip 110 or substrate 120. In accordance with the invention, the underfill shell is formed so that it is stiffer than the underfill bulk.

Different stiffnesses in the underfill shell and underfill bulk can be achieved in several ways. Since the ceramic filler of underfill material is harder than the epoxy polymer, increasing the proportion of filler material in one area of the underfill relative to another will increase the relative strength (hardness) of that area. Additionally, adding solvents such as acetone or toluene to an area of the underfill will increase the resilience of that area. Thus, in one embodiment of the invention an underfill shell is composed of a material with a higher proportion of filler than the material used in the underfill bulk. In another embodiment of the invention, an underfill bulk contains more solvents like acetone or toluene than the underfill shell. In still another embodiment, an underfill shell contains both more filler and less solvents than the underfill bulk.

Figure 4:
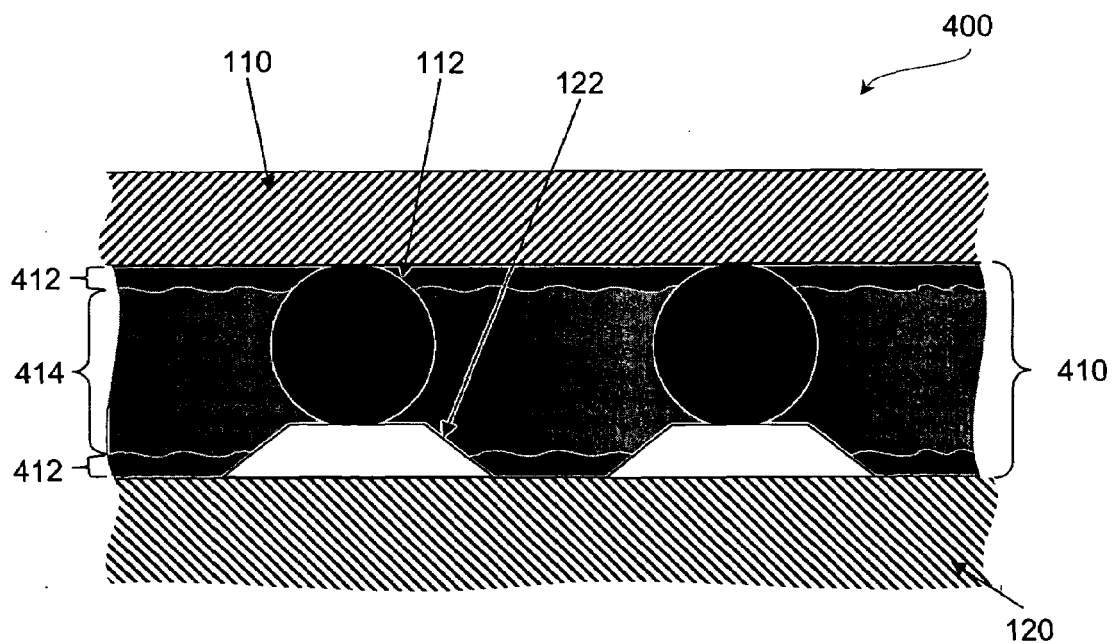
FIG. 4 is a cross-section of another embodiment of the present invention wherein the underfill is composed of a single material.

Another embodiment of the present invention is an underfill that is composed of a single material. In a particular embodiment, shown in FIG. 4, an underfill 410 is composed of a single material with varying stiffness that has a strong adhesion in a shell region 412 to chip 110 and substrate 120, but a weak internal adhesion in a bulk region 414. A long chain polymer with an active carboxyl group at the end of the chain is used as the underfill material in this embodiment. The polymer chains line up in such a way as to allow the long chains of the polymer to form weak bonds with each other in the bulk region 414, while the active carboxyl groups at the end of the chains form a strong adhesion to the bottom surface of chip 110 and top surface of substrate 120 in the shell region 412.

In yet another embodiment, the surfaces of chip 110 and substrate 120 that contact the underfill material are first treated with a curing substance (e.g., hydroflouric acid) in vaporized form. The curing substance causes the portion of underfill material that comes into contact with the curing substance to adhere strongly to the surfaces that were treated with the curing substance, in the shell region 412 while the rest of the underfill material remains uncured in the bulk region 414.

The foregoing description, for purposes of explanation, used specific nomenclature to provide a thorough understanding of the invention. However, it will be apparent to one skilled in the art that the specific details are not required in order to practice the invention. The embodiments were chosen and described in order to best explain the principles of the invention and its practical applications, to thereby enable others skilled in the art to best utilize the invention and various embodiments with various modifications as are suited to the particular use contemplated. Thus, the foregoing disclosure is not intended to be exhaustive or to limit the invention to the precise forms disclosed. Many modifications and variations are possible in view of the above teachings.

It is intended that the scope of the invention be defined by the following claims and their equivalents.

What is claimed:

1. An electronic package, comprising:
   a substrate having a first surface;
   an electronic device mounted on the first surface, wherein the electronic device has a second surface that faces the first surface; and
   an underfill positioned between the first surface and the second surface, wherein the underfill comprises:
   a shell that contacts the first surface and the second surface; and
   a bulk that is positioned between the surface material that contacts the first surface and the surface material that contacts the second surface;
   wherein the shell is stiffer than the bulk.

2. The electronic package in claim 1, wherein the shell and the bulk are made of different compositions of material.

3. The electronic package in claim 1, wherein the bulk comprises an epoxy-based polymer and the shell comprises an epoxy-based polymer with higher filler content than that of the bulk.

4. The electronic package in claim 1, wherein the shell and the bulk are made of a single material.

5. The electronic package in claim 4, wherein the material of the shell has a stronger adhesion to the first surface and the second surface than to itself.

6. The electronic package in claim 5, wherein the material of the shell is a long chain polymer with an active carboxyl group at the end of the chain.

7. The electronic package in claim 4, wherein the first surface and the second surface are coated with a curing substance that interacts with the underfill, such that where the underfill contacts the curing substance, the single material forms the shell.

8. The electronic package in claim 7, wherein the curing substance is hydrofluoric acid.

9. The electronic package in claim 8, wherein the first surface and second surface are coated with hydrofluoric acid by exposing the first surface and second surface with hydrofluorine gas vapor.

10. A method of constructing an electronic package, the electronic package including a substrate having a first surface and an electronic device having a second surface, the method comprising:
    mounting the electronic device on the substrate, wherein the first surface faces the second surface; and
    introducing an underfill between the first surface and the second surface, wherein the underfill comprises:
    a shell that contacts the first surface and the second surface; and
    a bulk that is positioned between the surface material that contacts the first surface and the surface material that contacts the second surface;
    wherein the shell is stiffer than the bulk material.

11. The method in claim 10, wherein the shell and the bulk are made of different compositions of material.

12. The method in claim 10, wherein the bulk comprises an epoxy-based polymer and the shell comprises an epoxy-based polymer with higher filler content than that of the bulk.

13. The method in claim 10, wherein the shell and the bulk are made of a single material.

14. The method in claim 13, wherein the material of shell has a stronger adhesion to the first surface and the second surface than to itself.

15. The method in claim 14, wherein the material of the shell is a long chain polymer with an active carboxyl group at the end of the chain.

16. The method in claim 14, the introducing step further comprising:
    coating the first surface and the second surface with a curing substance that interacts with the underfill such that where the underfill contacts the curing substance, the single materials forms the shell.

17. The method in claim 16, wherein the curing substance is hydrofluoric acid.

18. The method of claim 17, wherein the coating step further comprises exposing the first surface and second surface with hydrofluorine gas vapor.

* * * * *